United States Patent [19]

Noda

[11] Patent Number: 5,372,961
[45] Date of Patent: Dec. 13, 1994

[54] METHOD FOR MANUFACTURING A SEMICONDUCTOR INTEGRATED CIRCUIT DEVICE

[75] Inventor: Masanori Noda, Kanagawa, Japan

[73] Assignee: Sony Corporation, Tokyo, Japan

[21] Appl. No.: 903,269

[22] Filed: Jun. 24, 1992

[30] Foreign Application Priority Data

Jun. 25, 1991 [JP] Japan .................................. 3-180141

[51] Int. Cl.⁵ .......................................... H01L 21/335
[52] U.S. Cl. .................................... 437/45; 437/48
[58] Field of Search ............... 148/DIG. 109; 437/29, 437/45, 48, 58, 979

[56] References Cited

U.S. PATENT DOCUMENTS 4,406,049  9/1983  Tam et al. .
4,513,494  4/1985  Batra .

FOREIGN PATENT DOCUMENTS 55-27462  7/1980  Japan .
57-62543  4/1982  Japan ..................................... 437/48

*Primary Examiner*—George Fourson
*Attorney, Agent, or Firm*—Hill, Steadman & Simpson

[57] ABSTRACT

A method of manufacturing a ROM which has a memory cell array with a plurality of MIS transistors which are serially connected. An impurity of the same conductivity type as the semiconductor substrate is introduced by ion implantation after forming a field oxide and a gate electrode so as to compensate for an impurity of the opposite conductivity type, which is simultaneously ion implanted beneath the field oxide following ion implantation for programing so as to penetrate the gate electrode and a gate oxide. Punch through between adjacent cells is suppressed by the impurity of the same conductivity type.

2 Claims, 6 Drawing Sheets

METHOD FOR MANUFACTURING A SEMICONDUCTOR INTEGRATED CIRCUIT DEVICE

BACKGROUND OF THE INVENTION

1. Field of the Invention

The invention relates to a method for manufacturing a mask programmable read only memory (ROM) and, more particularly, to a method which is suitable for use in the manufacturing of a ROM with an array structure in which memory cell transistors are serially arranged.

2. Description of the Prior Art

A ROM is a device which is programmed (in which information is written) in the manufacturing step and its memory cells are constructed by MIS transistors. The ROM is mainly classified into a ROM (NOR type ROM) which is constructed by a memory cell array of the parallel type and a ROM (NAND type ROM) which is constructed by a memory cell array of the serial type. The NAND type ROM comprises a plurality of MIS transistor arrays in each of which MIS transistors are serially connected and which is suitable for realization of a large capacity because it is more advantageous than the NOR type ROM with respect to integration density.

The programming of the NAND type ROM is executed by controlling a threshold voltage of the MIS transistors constructing the memory cells by implanting impurity ions (channel doping). Hitherto, the ion implantation for programming is performed in the step before or after the formation of a gate insulating film. However, the NAND type ROM which is programmed in the step before or after the formation of the gate insulating film needs a number of steps for a period of time after the execution of the programming to the completion of the ROM. Consequently, a long time is required until the programmed ROM is completely manufactured; namely, a turn around time is long.

To reduce such a turn around time, there has been proposed a NAND type ROM in which the ion implantation for programming is executed by high energy such as to penetrate a gate electrode after the gate electrode was formed. FIGS. 1 to 5 show such an example. FIG. 1 is a plan view. FIGS. 2 to 5 are cross sectional views ten along the lines II—II, III—III, IV—IV, and V—V in FIG. 1, respectively.

As shown in FIGS. 1 to 5, in the NAND type ROM, a field insulating film 102 is formed like a stripe onto the surface p-type silicon (Si) substrate 101, thereby isolating devices. When the field insulating film 102 is formed, boron (B) as a p-type impurity which has previously been ion implanted in the p-type Si substrate 101 of a portion serving as an isolating region between devices is diffused, so that a p+-type channel stop region 103 is formed under the field insulating film 102.

A gate insulating film 104 is formed on the surface in a stripe-shaped active region surrounded by the field insulating films 102. In this case, ions of B are implanted into a channel region in the step before or after the formation of the gate insulating film 104 and the MIS transistors forming the memory cells are formed as the enhancement type.

Subsequently, word lines $WL_1'$, $WL_2'$, $WL_3'$, ... which extend in the direction which crosses perpendicularly to the longitudinal direction of the stripe-shaped active region are formed. After that, a resist pattern 105 having an opening 105a is formed in a predetermined portion according to the program.

The resist pattern 105 is used as a mask and phosphorus (P) ions as n-type impurities are implanted into the channel region so as to penetrate the word lines $WL_1'$, $WL_2'$, $WL_3'$, ... with a high energy (for example, about hundreds of keV). Consequently, the MIS transistor into which the P ions have been implanted through the opening 105a of the resist pattern 105 is formed as a depletion type and a desired program is executed.

In JP-A-64-46967, there has been proposed a method whereby in the NAND type ROM, all of the MOS transistors constructing the memory cells are previously formed as depletion type, and after a gate electrode was formed, the B ions are implanted into the channel region of only the selected MOS transistors so as to penetrate the gate electrode, thereby forming the selected MOS transistors as enhancement type, thereby reducing the energy for ion implantation for programming to about 200 keV.

In the conventional NAND type ROM show in FIGS. 1 to 5 mentioned above, since the P ion implantation for programming is executed by the high energy, the following problems occur. That is, in the case where the resist pattern 105 is used as a mask and the P ions are implanted by the high energy so as to penetrate the word lines $WL_1'$, $WL_2'$, $WL_3'$, ..., the P ions also pierce the field insulating film 102 in the portion of the opening 105a of the resist pattern 105, so that the P ions are implanted into the lower side portion of the field insulating film 102 as shown in FIGS. 2 and 5 (the implanted P ions are shown by broken lines in FIGS. 2 to 5). Thus, an impurity concentration of the channel stop region 103 under the field insulating film 102 decreases. Accordingly, there is a problem such that a punch-through easily occurs between the memory cell into which the ion implantation has been executed for programming and the memory cell adjacent to such a memory cell.

To solve the above problems, there is considered a method whereby the opening 105a of the resist pattern 105 to specify the region into which the ion implantation for programming is executed is reduced and the ion implantation region is limited to only the region on the active region. For this purpose, an accuracy of the lithography needs to be set to about 1.5 μm. However, it is actually difficult to realize such a high accuracy because of the mask alignment error or the like in the lithography process. The above method, therefore is not a practical method.

OBJECTS AND SUMMARY OF THE INVENTION

It is, therefore, an object of the present invention to provide a method for manufacturing a ROM, whereby by executing the ion implantation for programming after the formation of a gate electrode, a lead time which is required from the writing of information to the shipping is reduced and the occurrence of a punch-through between the adjacent memory cells in the lower portion of a field insulation film can be suppressed.

To accomplish the above object, according to the invention, there is provided a method of manufacturing a ROM which has a memory cell array comprising a plurality of MIS transistors of the first conductivity type which are serially connected and into which a programming is executed by controlling a threshold voltage of the selected MIS transistors by an ion implantation, wherein the method comprises the steps of: forming word lines by patterning a conductive film by using a resist pattern as a mask and, thereafter, ion implanting impurities of the second conductivity type into a semiconductor substrate so as to penetrate a field insulating film by using the resist pattern and the word lines as masks; and ion implanting impurities of the first conductivity type into a channel region of the selected MIS transistors in order to program so as to penetrate the word lines.

According to the manufacturing method of the invention with the above construction, after the word lines were formed, when the ion implantation of the impurities of the first conductivity type for programming is executed so as to penetrate the word lines, even if the impurities of the first conductivity type penetrate the field insulating film and are implanted into the lower portion thereof, the impurities of the second conductivity type have previously been ion implanted in such a lower portion by using the resist pattern and the word lines as masks, so that it is possible to prevent a decrease in impurity concentration of a channel stop region under the field insulating film. Consequently, the occurrence of a punch-through between the adjacent memory cells in the portion under the field insulating film is suppressed.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
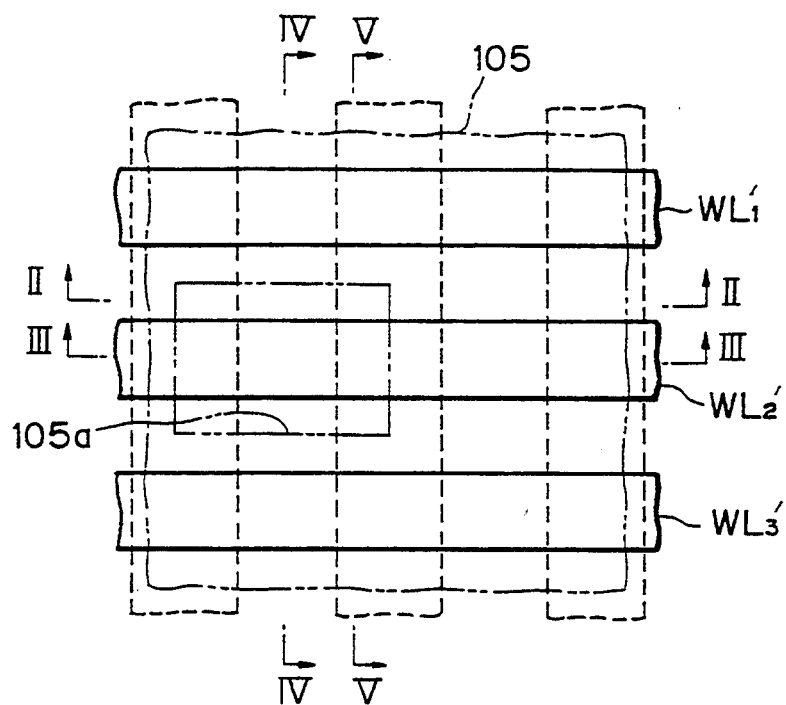
FIG. 1 is a plan view of a part of an ROM for explaining a conventional manufacturing method of an ROM.
Figure 2:
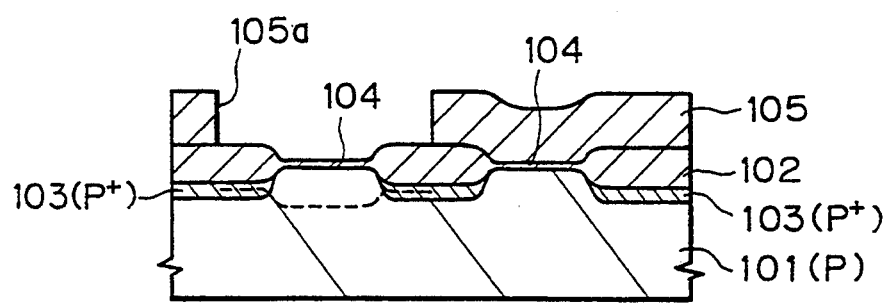
FIG. 2 is a cross sectional view taken along the line II—II in FIG. 1.
Figure 3:
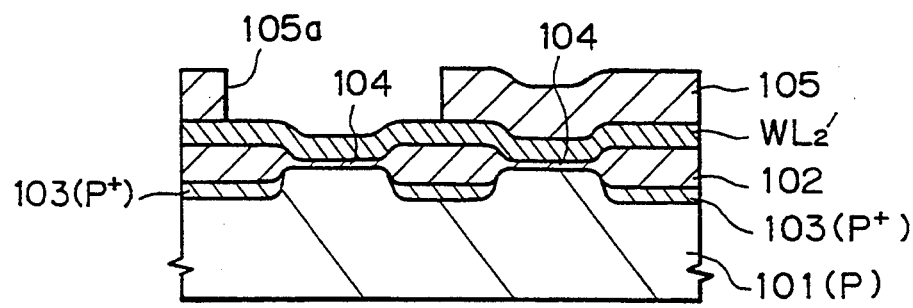
FIG. 3 is a cross sectional view taken along the line III—III in FIG. 1.
Figure 4:
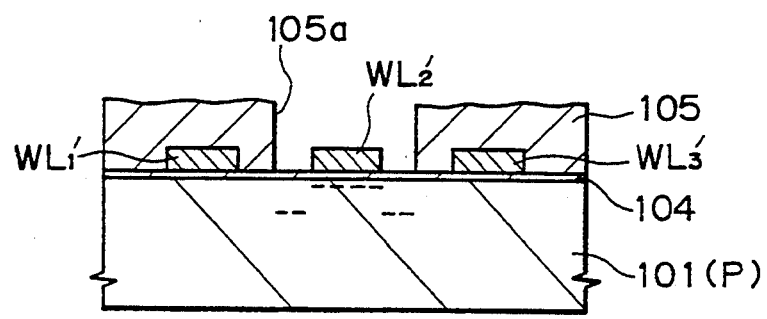
FIG. 4 is a cross sectional view taken along the line IV—IV in FIG. 1.
Figure 5:
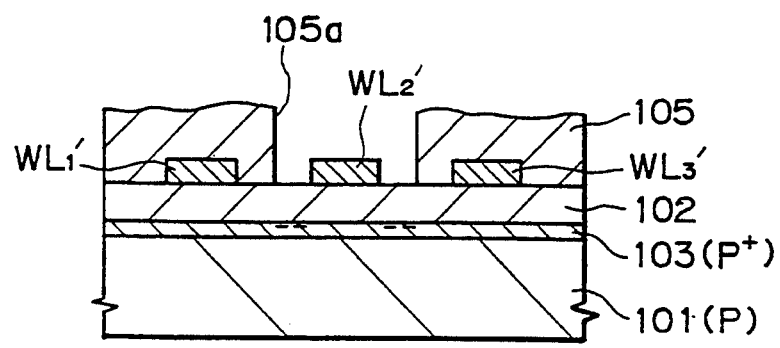
FIG. 5 is a cross sectional view taken along the line V—V in FIG. 1.
Figure 6:
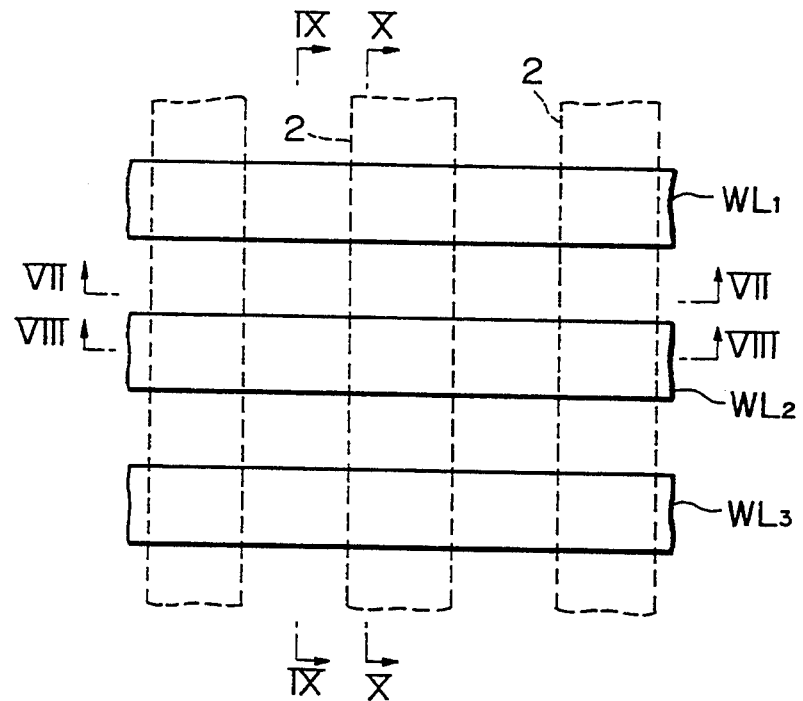
FIG. 6 is a plan view of a part of an ROM for explaining a manufacturing method of an ROM according to an embodiment of the invention.
Figure 7:
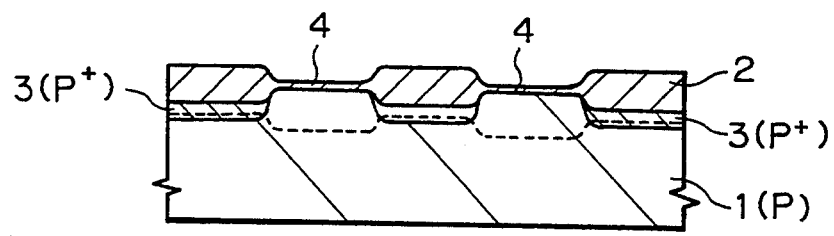
FIG. 7 is a cross sectional view taken along the line VII—VII in FIG. 6.
Figure 8:
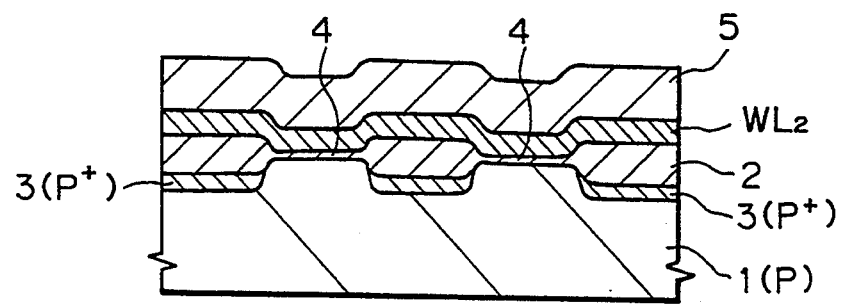
FIG. 8 is a cross sectional view taken along the line VIII—VIII in FIG. 6.
Figure 9:
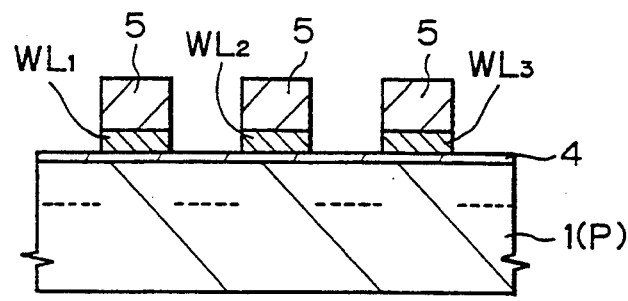
FIG. 9 is a cross sectional view taken along the line IX—IX in FIG. 6.
Figure 10:
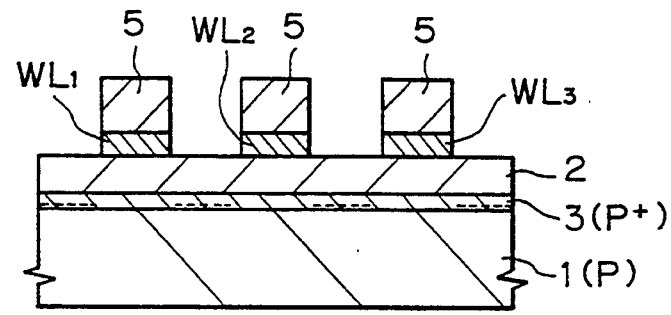
FIG. 10 is a cross sectional view taken along the line X—X in FIG. 6.
Figure 11:
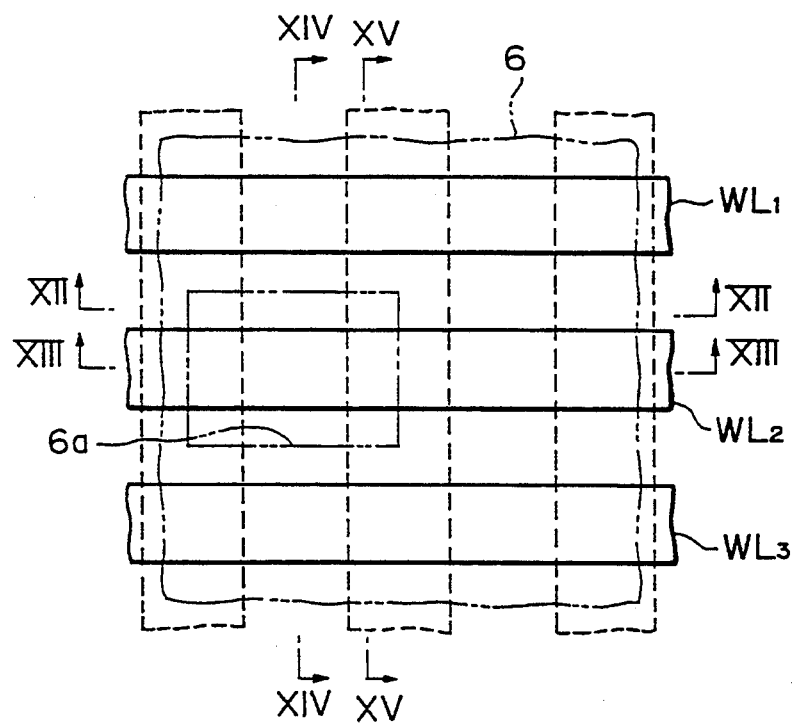
FIG. 11 is a plan view of a part of an ROM for explaining a manufacturing method of an ROM according to an embodiment of the invention.
Figure 12:
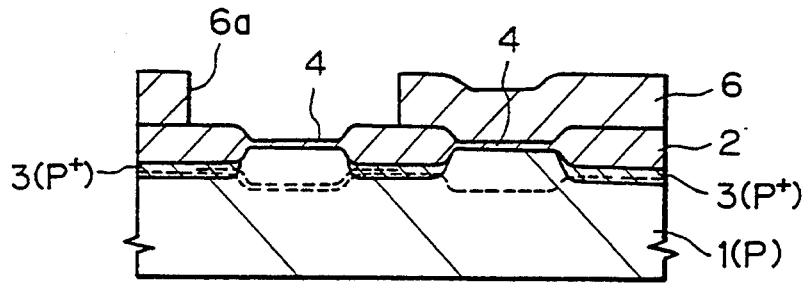
FIG. 12 is a cross sectional view taken along the line XII—XII in FIG. 11.
Figure 13:
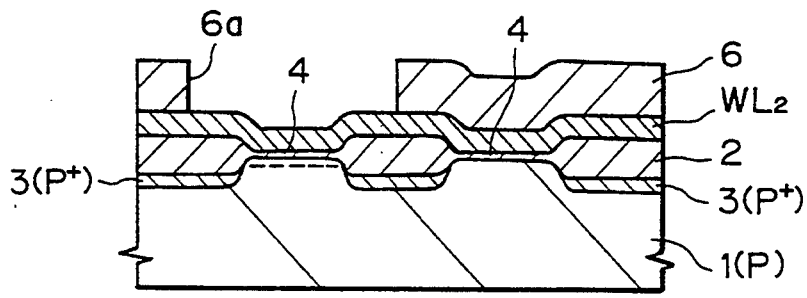
FIG. 13 is a cross sectional view taken along the line XIII—XIII in FIG. 11.
Figure 14:
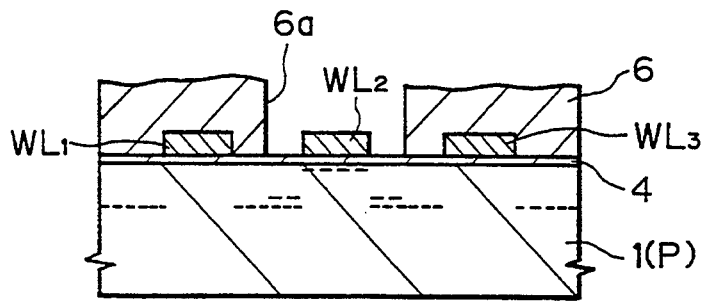
FIG. 14 is a cross sectional view taken along the line XIV—XIV in FIG. 11.
Figure 15:
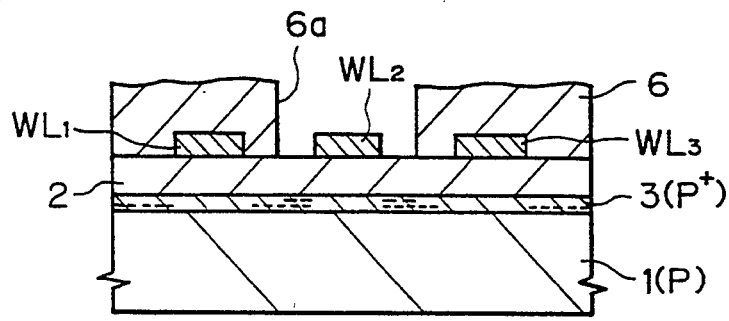
FIG. 15 is a cross sectional view taken along the line XV—XV in FIG. 11.

An embodiment of the present invention will be described hereinbelow with reference to the drawings.

In a manufacturing method of a NAND type ROM according to the embodiment, as shown in FIGS. 6 to 10, a stripe-shaped field insulating film 2 such as a $SiO_2$ film is first formed onto the surface of a p-type Si substrate 1 by, for example, a LOCOS method. At this time, a $p^+$-type channel stop region 3 is formed under the field insulating film 2.

A gate insulating film 4 such as a $SiO_2$ film is subsequently formed on the surface of a stripe-shaped active region surrounded by the field insulating film 2 by a thermal oxidation method. In this case, by implanting B ions into the channel regions in the step before or after the formation of the gate insulating film 4, MIS transistors which form the memory cells are formed as an enhancement type.

For instance, a polycrystalline Si film as a conductive film to form word lines is formed onto the whole surface by a CVD method. After that, impurities are doped into the polycrystalline Si film, thereby reducing the resistance. A resist pattern 5 having shapes corresponding to word lines is then formed onto the polycrystalline Si film by a lithography. After that, the resist pattern 5 is used as a mask and the polycrystalline Si film is patterned into a predetermined shape by, for example, a reactive ion etching (RIE) method, thereby forming word lines $WL_1$, $WL_2$, $WL_3$, .... The word lines $WL_1$, $WL_2$, $WL_3$, ... can be also formed by a polycide film in which a metal silicide film of a high melting point is overlaid onto the polycrystalline Si film. In such a case, the metal silicide film of a high melting point is overlaid onto the polycrystalline Si film and, thereafter, the metal silicide film of a high melting point and the polycrystalline Si film are patterned by using the resist pattern 5 as a mask.

In a state in which the resist pattern 5 is left on the word lines $WL_1$, $WL_2$, $WL_3$, ..., for example, B ions are implanted by such an energy so as to penetrate the field insulating film 2 by using the resist pattern 5 and the word lines $WL_1$, $WL_2$, $WL_3$, ... as masks (in FIGS. 7 to 10, the implanted B ions are shown by broken lines). By the ion implantation of B, an impurity concentration of the channel region 3 under the field insulating film 2 rises.

After the resist pattern 5 is removed, the steps for programming are executed in a manner similar to the conventional method. That is, as shown in FIGS. 11 to 15 a resist pattern 6 having an opening $6a$ is formed in a predetermined portion according to the program by a lithography. After that, P ions are implanted by such a high energy so as to penetrate the word lines $WL_1$, $WL_2$, $WL_3$, ... by using the resist pattern 6 as a mask (in FIGS. 12 to 15, the implanted P ions are shown by broken lines), so that the programming is executed.

In the above ion implantation of P for programming and the ion implantation of B for increasing the impurity concentration of the channel stop region 3, when a projected range of the implanted impurities assumes $R_p$ and its projected standard deviation assumes $\Delta R_p$, a value of $(R_p + \Delta R_p)$ in case of B is set to be slightly deeper (for example, 50 to 100 nm) than that in case of P and a dose of B is set to a value which is 1.5 to 2 times as large as a dose of P. Practically speaking, an energy for ion implantation P for programming is set to 250 to 400 keV and a dose is set to e.g., (1 to 5)×10$^{13}$ cm$^{-2}$. On the other hand, an energy for ion implantation of B is set to a value of, for example, 100 to 200 keV and a dose is set to, e.g., (2 to 10)×10$^{13}$ cm$^{-2}$.

After the programming has been executed as mentioned above, the resist pattern 6 is removed. After that, by the ion implantation using the word lines WL$_1$, WL$_2$, WL$_3$, . . . as a mask, a source region and a drain region are formed, an interlayer insulating film is formed, contact holes are formed, wirings are formed, a passivation film is formed, and the like, thereby completing a desired ROM of the NAND type.

According to the embodiment as mentioned above, before the P ions for programming are implanted, the resist pattern 5 and the word lines WL$_1$, WL$_2$, WL$_3$, . . . are used as masks and the B ions as impurities of the same conductivity type as that of the channel stop region 2, namely, of the p-type are implanted into the lower side of the field insulating film 2. Therefore, even when the P ions are planted into the lower side of the field insulating film 2 upon ion implantation for programming, a decrease in impurity concentration of the channel stop region 3 can be prevented. Consequently, it is possible to effectively suppress the occurrence of a punch-through between the adjacent memory cells in the portion under the field insulating film 2 by the ion implantation of P for programming. Since the ion implantation for programming is executed after the word lines WL$_1$, WL$_2$, WL$_3$, . . . were formed, the turn around time can be reduced.

In the memory cell portion, when the B ions are implanted by using the resist pattern 5 and the word lines WL$_1$, WL$_2$, WL$_3$, . . . as masks as in the above embodiment, a breakdown voltage BV$_{DS}$ between the source and the drain of the MIS transistor constructing the memory consequently decreases. Such a drop of BV$_{DS}$ does not cause a problem particularly in the memory cell portion using a low power source voltage V$_{dd}$. However, in the peripheral circuit section using a high power source voltage V$_{cc}$, hot carriers are generated and a leak current due to a gate induced subbreakdown or the like easily occurs. Methods of solving such problems will now be described hereinbelow.

Figure 16A:
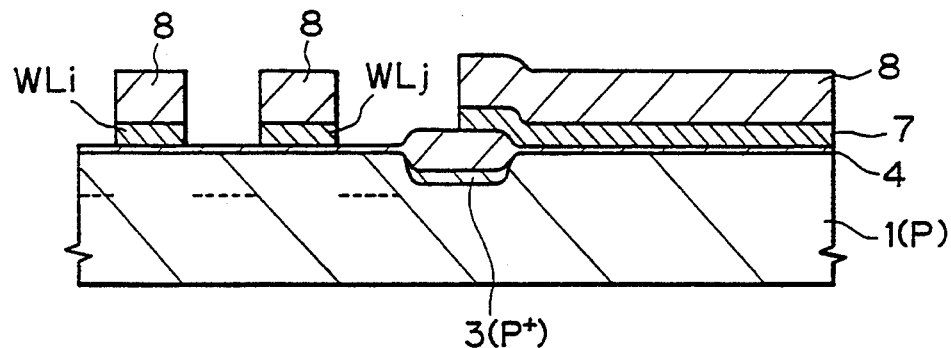
FIGS. 16A and 16B are cross sectional views for explaining another embodiment of the invention.

According to the first method, as shown in FIG. 16A, after the field insulating film 2 and the gate insulating film 4 were formed, a polycrystalline Si film 7 is formed onto the whole surface as a conductive film to form word lines and a gate electrode by a CVD method. A resist pattern 8 is subsequently formed onto the polycrystalline Si film 7 so as to have a shape corresponding to the word lines in the memory cell portion. In the peripheral circuit portion, the resist pattern 8 has such a shape so as to perfectly cover the peripheral circuit portion.

Subsequently, by etching the polycrystalline Si film 7 by using the resist pattern 8 as a mask, word lines WL$_i$ and WL$_j$ are formed in the memory cell portion. The polycrystalline Si film 7 is completely left in the peripheral circuit portion. After that, in a state in which the resist pattern 8 is left, B ions are implanted in order to increase an impurity concentration of the channel stop region 3 by using the resist pattern 8 and the word lines WL$_i$ and WL$_j$ as masks.

Figure 16B:
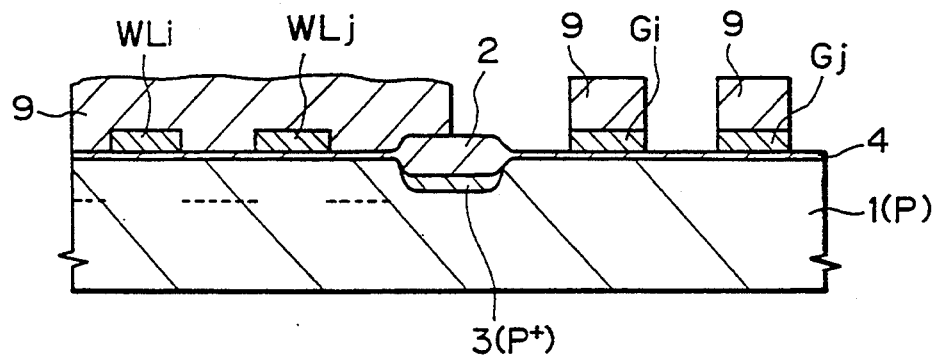

After the resist pattern 8 has been removed, as shown in FIG. 16B, a resist pattern 9 is formed so as to have a shape corresponding to gate electrodes of the MIS transistor in the peripheral circuit portion. In the memory cell portion, the resist pattern 9 has such a shape so as to completely cover the memory cell portion. After that, by etching the polycrystalline Si film 7 of the peripheral circuit portion by using the resist pattern 9 as a mask, gate electrodes G$_i$ and G$_j$ of the MIS transistor of the peripheral circuit portion are formed.

According to the first method, the ion implantation of B which is executed to suppress the occurrence of the punch-through between the adjacent memory cells in the portion below the field insulating film 2 is performed only for the memory cell portion and is not performed for the peripheral circuit portion, so that no problem occurs due to the ion implantation of B.

The order of the processing steps shown in FIGS. 16A and 16B can be also reversed. That is, after the gate electrodes G$_i$ and G$_j$ of the MIS transistor of the peripheral circuit portion were first formed, the word lines WL$_i$ and WL$_j$ of the memory cell portion are formed by masking the gate electrodes G$_i$ and G$_j$ by the resist pattern. After that, the B ions can be also implanted in a state in which the resist pattern used for patterning is left for other word lines WL$_i$ and WL$_j$.

Figure 17:
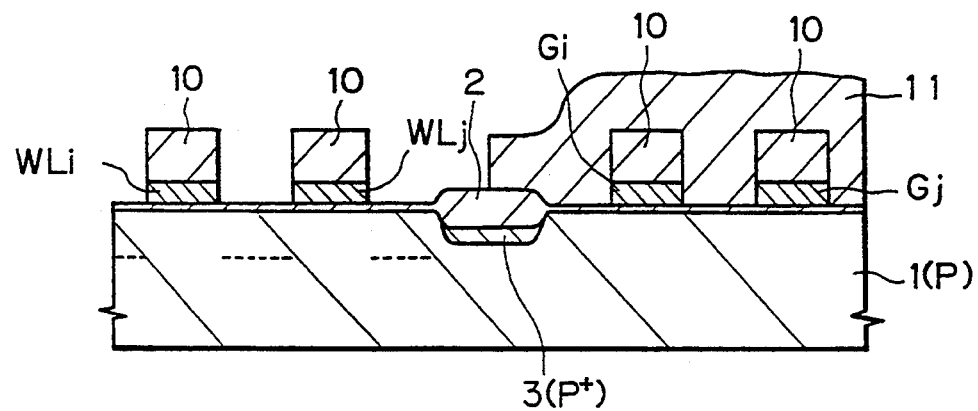
FIG. 17 is a cross sectional view for explaining further another embodiment of the invention.

According to the second method, as shown in FIG. 17, after a polycrystalline Si film to form word lines and gate electrodes was formed onto the whole surface, a resist pattern 10 having a shape corresponding to the word lines and the gate electrodes is formed onto the polycrystalline Si films in the memory cell portion and the peripheral circuit portion, respectively. By etching the polycrystalline Si film by using the resist pattern 10 as a mask, the word lines WL$_i$ and WL$_j$ of the memory cell portion and the gate electrodes G$_i$ and G$_j$ of the peripheral circuit portion are formed.

In a state in which the resist pattern 10 used for patterning the polycrystalline Si film is left, the surface of the peripheral circuit portion is covered by another resist pattern 11. In this state, B ions are implanted into the memory cell portion in order to suppress the occurrence of a punch-through between the adjacent memory cells.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A method of manufacturing a semiconductor integrated circuit device having a series gate matrix in which insulated-gate field effect transistors are arranged in rows and columns and are serially connected to each other in each row, including the steps of:

(a) forming an insulating layer on the surface of a semiconductor substrate of a first conductivity type, said insulating layer having a plurality of substantially parallel slots forming relatively thin insulating film, and relatively thick insulating film between adjacent slots, said slots extending along a row direction;

(b) forming a conductive film over said substrate;

(c) selectively forming a resist pattern on said conductive film along a column direction being substantially perpendicular to said slots;

(d) selectively forming a plurality of gate electrodes using said resist pattern;

(e) introducing an impurity of said first conductivity type into said semiconductor substrate through said relatively thick insulating film using said resist patterns and said gate electrodes as masks between said gate electrodes to form a channel stopper diffusion layer beneath said relatively thick insulating film to increase the impurity concentration of the first conductivity type;

(f) selectively forming a plurality of masking layers over said substrate; and (g) introducing an impurity of a second conductivity type into said semiconductor substrate so as to activate areas under said gate electrodes and said relatively thin insulating film using said masking layers and said relatively thick insulating film as masks.

2. A method according to claim 1, wherein an outer region of said series gate matrix is covered with a masking material when an impurity of said first conductivity type is introduced.

* * * * *